United States Patent [19]

Yu et al.

[11] Patent Number: 5,858,621
[45] Date of Patent: Jan. 12, 1999

[54] BI-LAYER SILYLATION PROCESS USING ANTI-REFLECTIVE-COATINGS (ARC) FOR MAKING DISTORTION-FREE SUBMICROMETER PHOTORESIST PATTERNS

[75] Inventors: Chen-hua Yu; Chia Shiung Tsai, both of Hsin-chu, Taiwan

[73] Assignee: Taiwan Semiconductor Manufacturing Company, Ltd., Hsin-chu, Taiwan

[21] Appl. No.: 788,874

[22] Filed: Jan. 22, 1997

[51] Int. Cl.$^6$ ........................................................ G03C 5/00
[52] U.S. Cl. ............................ 430/313; 430/312; 430/325
[58] Field of Search ...................... 430/312, 313, 430/325

[56] References Cited

U.S. PATENT DOCUMENTS

| | | | |
|---|---|---|---|
| 4,370,405 | 1/1983 | O'Toole et al. | 430/312 |
| 4,882,008 | 11/1989 | Garza et al. | 156/643 |
| 5,286,608 | 2/1994 | Roh | 430/313 |
| 5,294,680 | 3/1994 | Knors et al. | 525/327.4 |
| 5,401,614 | 3/1995 | Dichiara et al. | 430/323 |
| 5,407,786 | 4/1995 | Ito et al. | 430/313 |
| 5,525,192 | 6/1996 | Lee et al. | 156/651.1 |

*Primary Examiner*—John A. McPherson
*Assistant Examiner*—Rosemary Ashton
*Attorney, Agent, or Firm*—George O. Saile; Stephen B. Ackerman

[57] ABSTRACT

A novel bi-layer using a silylation process and anti-reflective coatings are employed for making distortion-free submicrometer photoresist patterns. The method involves forming a multilayer composed of a bottom anti-reflective coating (BARC), a first photoresist layer, a middle anti-reflective coating (MARC), and a silylated second photoresist layer for patterning an underlying electrically conducting layer, such as for FET gate electrodes. The upper photoresist layer is then optically exposed through a mask to form a latent image, and is silylated selectively to form a silicon rich region. The BARC and MARC layers prevent reflected radiation from the underlying structure during the optical exposure, thereby providing a distortion-free latent image. The selective silylation of the latent image portion of the photoresist serves as an excellent etch mask for oxygen plasma etching which is then used to pattern the remaining photoresist layer and anti-reflective coatings. The resulting distortion-free photoresist pattern is then used as an etch mask for etching the underlying electrically conducting layer.

22 Claims, 2 Drawing Sheets

BI-LAYER SILYLATION PROCESS USING ANTI-REFLECTIVE-COATINGS (ARC) FOR MAKING DISTORTION-FREE SUBMICROMETER PHOTORESIST PATTERNS

BACKGROUND OF THE INVENTION (1) Field of the Invention

The present invention relates to a photolithographic process, and more particularly to a method for forming submicrometer patterns of photoresist using a silylation process and anti-reflective coating techniques that provide high-fidelity, distortion-free photoresist patterns. The method is used to make submicrometer gate electrodes for field effect transistors (FETs).

(2) Description of the Prior Art

Today's Ultra Large Scale Integration (ULSI) on semiconductor substrates requires the patterning of closely spaced submicrometer lines in semiconductor materials such as polysilicon, metals, and insulators, and more specifically for making FET gate electrodes. Advances in photolithographic techniques and in anisotropic (directional) etching have substantially decreased the line widths and spacings between lines. For example, improvements in optical exposures and photoresist materials have lead to submicrometer resolution in photoresist image sizes. Directional plasma etching has resulted in submicrometer patterns being replicated in the underlying semiconductor layers using these photoresist images as an etch mask. Unfortunately, high resolution submicrometer images in photoresist require shallow depth of focus during exposure, but thick photoresist patterns are required because of the poor etch rate between the photoresist layer and underlying semiconductor layer.

Typically these submicrometer closely spaced lines are formed on substrates having non-planar surfaces and other irregular structures. These rough or irregular topographies make it difficult to use a single layer of photoresist without having distorted images. These distorted images can result from the scattered radiation from the underlying structures during the exposure of the photoresist layer. One prior method of minimizing these distorted images is to use a multilayer photoresist technique. For example, a three-layer process consisting of a bottom photoresist, an intermediate spin-on glass (SOG), and an upper high-resolution photoresist layer is deposited by spin coating. Optical exposure methods are used to pattern the upper photoresist layer, and then anisotropic plasma etching is used to replicate the pattern in the underlying SOG and bottom photoresist layers. This involves a complicated process in which two reactive ion etching (RIE) steps are used: one to etch the SOG, and then using the SOG as a mask to pattern the underlying photoresist layer using a second RIE step. The relatively thick bottom photoresist layer forms an essentially flat surface over the underlying structure. This photoresist absorbs the reflected light scattered from the underlying rough topography during exposure.

To simplify this process, an alternate technique using a silylation process can be used. In this method a single layer of photoresist is used and exposed using a mask to form latent images in the photoresist. Silicon compounds are then applied to the photoresist surface. These compounds, which are selectively absorbed on the exposed portions of the photoresist having the latent images, form a patterned silylated layer. The photoresist is then patterned by an etching process, such as RIE in oxygen ($O_2$), to remove the non-exposed portions of the photoresist layer, while the silylated portions form an effective mask to the oxygen etching. One method of forming improved silylated images is described by S. Ito et al. in U.S. Pat. No. 5,407,786. In this method ammonia is used before or after the photoresist layer is exposed, then the photoresist layer is treated with hexamethyldisilazane (HMDS) to provide an improved silylation layer on the exposed portions of the photoresist. The silylated patterned portions provide a good etch mask in oxygen plasma etching for replicating the underlying photoresist layer. Another method, similar to Ito's, of forming submicrometer resist patterns using a silylation process is described by J. S. Lee in U.S. Pat. No. 5,525,192 in which the photoresist layer is treated with an alkali solution to form an insoluble layer, and then latent images are formed by optical exposure using a mask. Selective etching is used to remove portions of the exposed photoresist layer to about the thickness of the insoluble layer and the portions of the exposed photoresist layer are then silylated. The silylated portions are used as an $O_2$ RIE mask.

Unfortunately, the scattered radiation from the rough underlying topography during exposure of the single layer of photoresist can still result in distorted latent images which are silylated. These silylated patterns are then replicated by plasma etching in oxygen in the underlying resist, still resulting in distorted patterns. Therefore there is still a need in the semiconductor industry to improve on the silylation process that also minimizes or eliminates the distorted images that can occur from the reflected light while providing a cost-effective manufacturing process.

SUMMARY OF THE INVENTION

It is a principal object of this invention to provide a silylation process having an anti-reflective coating (ARC) layer over the rough underlying structure or between a first photoresist and a second photoresist where a silylation pattern is formed on the second photoresist layer.

It is another object of this invention to provide a silylation process having a anti-reflective coating layer over the rough underlying structure and also between a first photoresist layer and a second photoresist layer to provide the best anti-reflection result for forming a distortion-free silylation pattern.

It is still another object of this invention to apply this novel bi-layer silylation process with anti-reflective coatings to form submicrometer gate electrodes for field effect transistors (FETs).

In accordance with these objectives, the invention consists of forming a submicrometer photoresist pattern on a substrate for etching FET gate electrodes using a bi-layer silylation process with two anti-reflective coatings (ARCs). The pattern is formed over a polysilicon layer or a silicide layer on a substrate having a Field OXide (FOX) surrounding and electrically isolating device areas in which the gate electrodes are built. The FOX is formed by conventional methods, such as LOCal Oxidation of Silicon (LOCOS), or a Shallow Trench Isolation (STI) can be used in which an isolation trench is etched in the substrate and filled with an insulating layer, such as chemical vapor deposited (CVD) silicon oxide ($SiO_2$). The CVD oxide is then etched or polished back to form an essentially coplanar surface with the substrate surface. The device areas are then thermally oxidized to form the gate oxide for the FETs. A doped polysilicon layer or a polycide (polysilicon/silicide) layer is deposited on the substrate. A bottom anti-reflective coating (BARC), such as an organic or inorganic layer, is deposited over the polysilicon or polycide layer. The preferred anti-reflective coating is an inorganic layer such as amorphous silicon (alpha-Si) or titanium nitride (TiN) since it can be easily etched at the same time that the polysilicon or polycide is etched. This BARC layer is optional in this invention.

A first photoresist layer is coated on the bottom anti-reflective coating layer. This photoresist layer is then baked to achieve cross-linking and to improve adhesion to the next layer to be applied. Preferably the photoresist is a negative photoresist. To further improve the anti-reflective properties, a second, or middle anti-reflective coating (MARC) layer is deposited on the first photoresist layer. The MARC is preferably composed of the same material used to form the BARC. A second photoresist layer is deposited over the MARC layer and is used as the silylation photoresist layer. The second photoresist layer can be either positive or negative type photoresist. A latent image pattern is formed in the second photoresist layer by optically exposing, such as by ultraviolet radiation, through a mask where the silylated patterns are desired. The second photoresist (or silylation) layer is then baked to cross-link the exposed areas. A silylation layer is now selectively formed on the latent image patterns by carrying out a silylation process, such as by heating the substrate in a hexamethyldisilazane (HMDS) atmosphere. This results in a silylated layer rich in silicon that provides an excellent etching mask for dry (plasma) etching in oxygen. Submicrometer patterns are now formed in the silylated photoresist layer by plasma-enhanced dry etching, for example using an oxygen plasma. This removes the unsilylated portions of the second photoresist layer, the anti-reflective coatings, and the first photoresist layer down to the polysilicon or polycide layer, while the silylated photoresist patterns remain essentially unetched. The distortion-free silylated photoresist patterns having essentially vertical sidewalls are now used as an etch mask to pattern the polysilicon or polycide layer to form gate electrodes for the field effect transistors (FETs).

Although the invention is shown for forming FET gate electrodes, it should be well understood by one skilled in the art that other conducting layers can be patterned in a similar fashion to form closely spaced and distortion-free lines.

BRIEF DESCRIPTION OF THE DRAWINGS

The objects and other advantages of this invention are best understood by referring to the attached drawings and detailed embodiment.

DESCRIPTION OF THE PREFERRED EMBODIMENT

The invention describes in detail a method for forming submicrometer photoresist images utilizing one or two anti-reflective coatings and a silylation process for etching gate electrodes for field effect transistors. The reflected light from the underlying irregular surface during optical exposure of a top silylated photoresist layer is minimized by the method of this invention, so as to provide a silylated photoresist pattern which is distortion-free.

Figure 1:
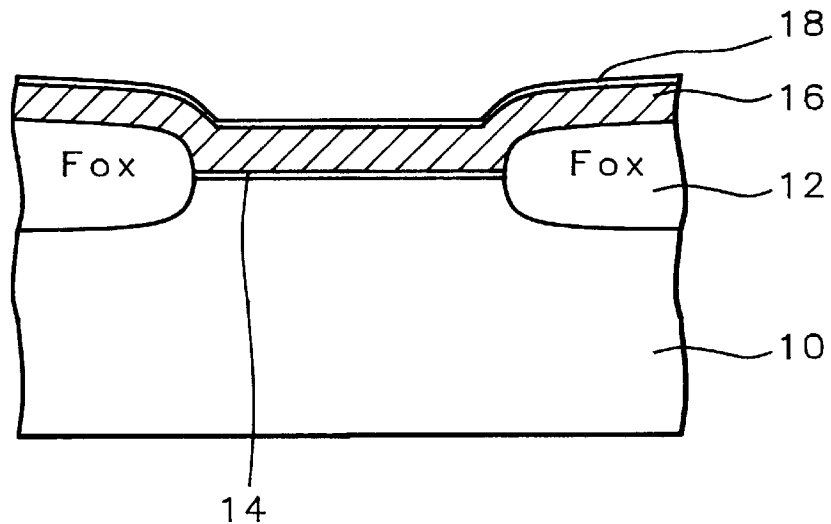
FIGS. 1 through 4 illustrate schematically cross-sectional views of a substrate having the preferred embodiment which shows the sequence of processing steps for forming a novel bi-level silylation process with anti-reflective coatings (ARC).

Referring now to FIG. 1, a cross-sectional view of a portion of a substrate 10 is shown. A substrate is typically composed of a single crystal silicon having a <100> crystallographic orientation which, for example, can be doped with P type impurities, such as boron (B), for making N-channel FETs, or doped with N type impurities, such as arsenic (As), for making P-channel FETs. It should be also clear that by providing P and N wells in the substrate, both types of FETs can be built for forming CMOS circuits.

Continuing with the process and still referring to FIG. 1, a Field OXide (FOX) 12 is formed to surround and electrically isolate device areas in which the gate electrodes are built. The FOX can be formed by conventional methods, such as the LOCal Oxidation of Silicon (LOCOS). Alternatively, a Shallow Trench Isolation (STI), such as a Buried OXide (BOX) isolation technology, can be used. The LOCOS, for example, is formed by depositing an oxidation barrier layer, such as silicon nitride ($Si_3N_4$), and patterned leaving openings over the regions where the FOX is desired. A thermal oxidation is then used to form the FOX, resulting in a non-planar surface. The process steps for making the FOX 12 are not depicted in FIG. 1. When an STI is used, a shallow trench is etched in the substrate 10 and refilled with a chemical vapor deposited (CVD) silicon oxide ($SiO_2$) that is then etched or chemical/mechanically polished back to yield a planar surface. The BOX method is not depicted in the figures. A gate oxide 14 is then formed on the exposed silicon surface in the device areas by thermal oxidation in an oxidation furnace using, for example, a dry oxygen. A polysilicon layer 16 is deposited next from which the gate electrodes are eventually formed. Preferably polysilicon layer 16 is deposited using low pressure chemical vapor deposition (LPCVD) using a reactant gas such as silane ($SiH_4$), and the polysilicon is deposited to a thickness of between about 500 and 3000 Angstroms. Polysilicon layer 16 can be doped by ion implantation using, for example, arsenic ions ($As^{75}$) resulting in a final concentration of between about 5.0 E 19 and 5.0 E 20 atoms/$cm^3$. Alternatively, a silicide layer, such as a tungsten silicide ($WSi_2$), can be formed on layer 16 to provide a polycide layer to further improve the electrical conductivity. For example, one method of forming the silicide is by CVD using tungsten hexafluoride ($WF_6$) as a reactant gas and is deposited to a thickness of between about 500 and 2000 Angstroms. The silicide layer forms part of layer 16 and is not depicted separately in FIG. 1.

Referring now more specifically to the method of this invention, a first, or Bottom Anti-Reflective Coating (BARC) 18 is formed on layer 16. Preferably, the BARC is coated to a thickness equal to one-quarter the wavelength of the radiation used to expose the photoresist image in a subsequent processing step. Typically the thickness of BARC layer 18 would be between about 50 and 300 Angstroms. Preferably layer 18 is composed of a polymer, such as an organic or inorganic layer. The preferred anti-reflective coating is an inorganic layer such as amorphous silicon (alpha-Si) or titanium nitride (TiN) since it can be easily etched at the same time that the polysilicon or polycide is etched.

Figure 2:
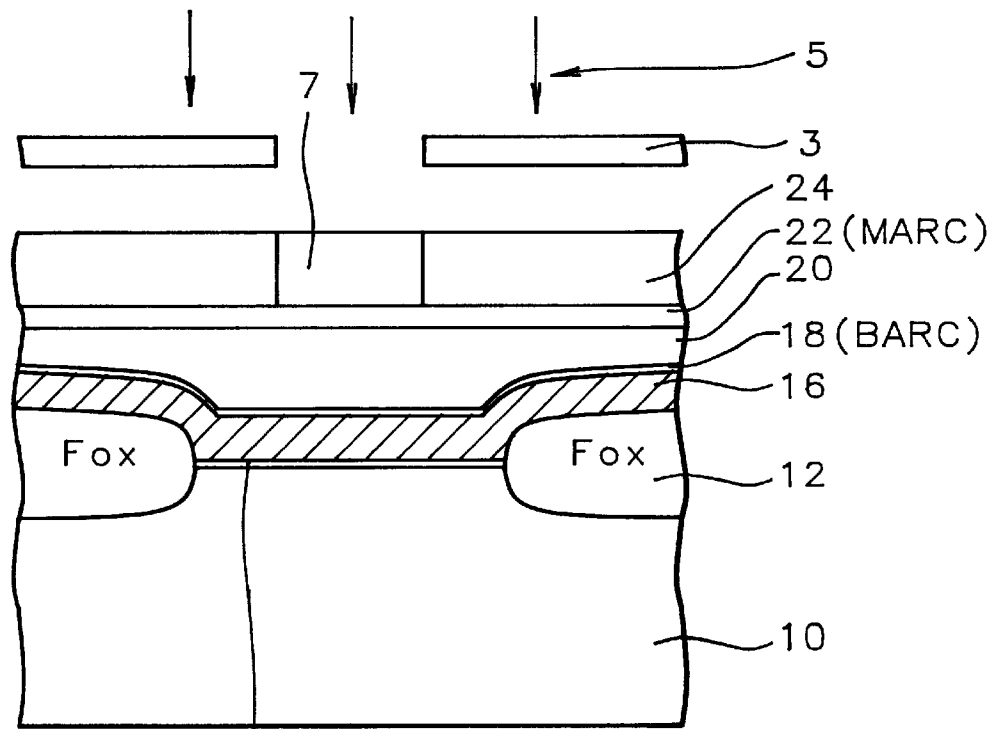

Referring to FIG. 2, a first photoresist layer 20 is deposited on BARC layer 18, typically by spin coating. Photoresist layer 20 is then baked to achieve cross-linking and to promote adhesion to the next coating to be applied. Layer 20 is either a positive or negative type photoresist and is coated to a thickness of between about 1000 and 5000 Angstroms. For example, one type of photoresist that can be used for this application is type IP-3600, manufactured by TOK Company of Japan. First photoresist layer 20 provides a levelling effect, which provides a more planar surface, on which exposure of high resolution patterns (images) requiring a shallower depth of focus is achieved.

Referring still to FIG. 2, a second, or Middle Anti-Reflective Coating (MARC) 22 is deposited over the more planar first photoresist layer 20. Layer 22 further reduces the reflected light during optical exposure of the photoresist. The thickness of layer 22 is selected to provide destructive interference with the reflected light. Preferably the thickness of layer 22 is equal to one-quarter the optical path length of the exposing radiation in layer 22. Typically the thickness of layer 22 is between about 50 and 500 Angstroms. The MARC layer 22 can be composed of an organic or inorganic layer, but preferably is an inorganic layer such as alpha-Si, TiN, or the like. A second photoresist layer 24 is deposited over the MARC layer 22, for example by spin coating. Preferably layer 24 is deposited to a thickness of between about 2000 and 3500 Angstroms and is composed of a positive or negative type photoresist. A latent image pattern 7 is formed in the second photoresist layer 24 by optically exposing through a mask 3, also depicted in FIG. 2, to define regions in the photoresist 24 where the gate electrodes are desired. The optical exposure is carried out using ultraviolet radiation 5 having a shorter wavelength which improves resolution. Preferably the wavelength is in a range between about 2480 and 3650 Angstroms. The second photoresist layer 24 is then baked to cross-link the exposed areas. For example, the photoresist can be baked at a temperature of between about 130° and 160° C. for about 0.5 to 2 minutes.

Figure 3:
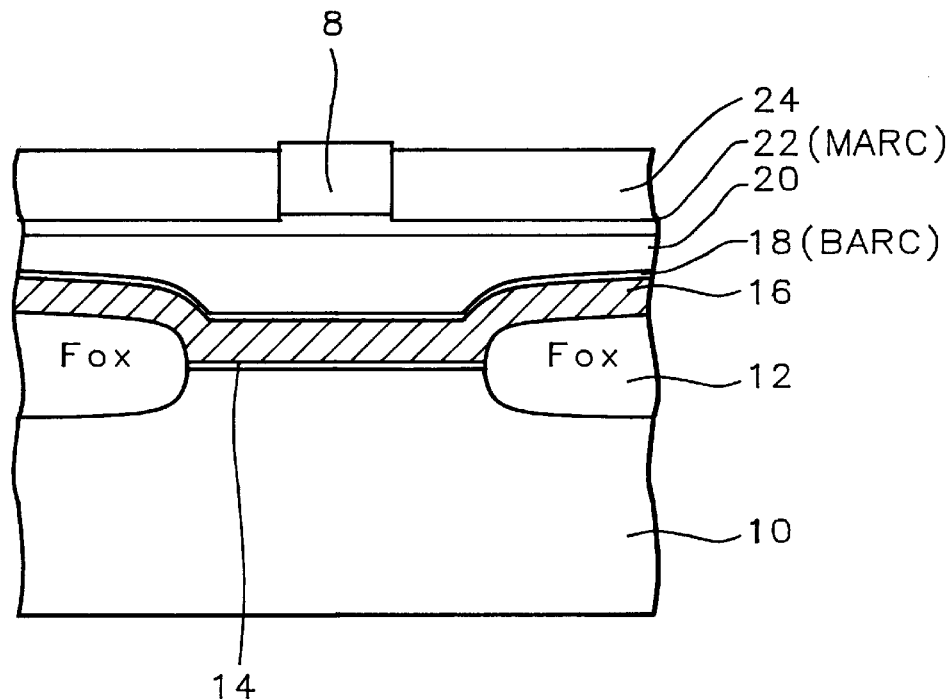

Referring now to FIG. 3, the exposed photoresist forming the latent image 7 is selectively treated to form a silylated photoresist 8. For example, one method of forming the silylated photoresist pattern 8 is to subject the photoresist layer 24 to a silylation agent such as hexamethyldisilazane (HMDS). For example, the photoresist layer can be heated in an HMDS atmosphere in which the HMDS diffuses into the exposed photoresist to form the silylated regions 8. This results in a silylated layer rich in silicon that provides an excellent etching mask for dry (plasma) etching in oxygen.

Figure 4:
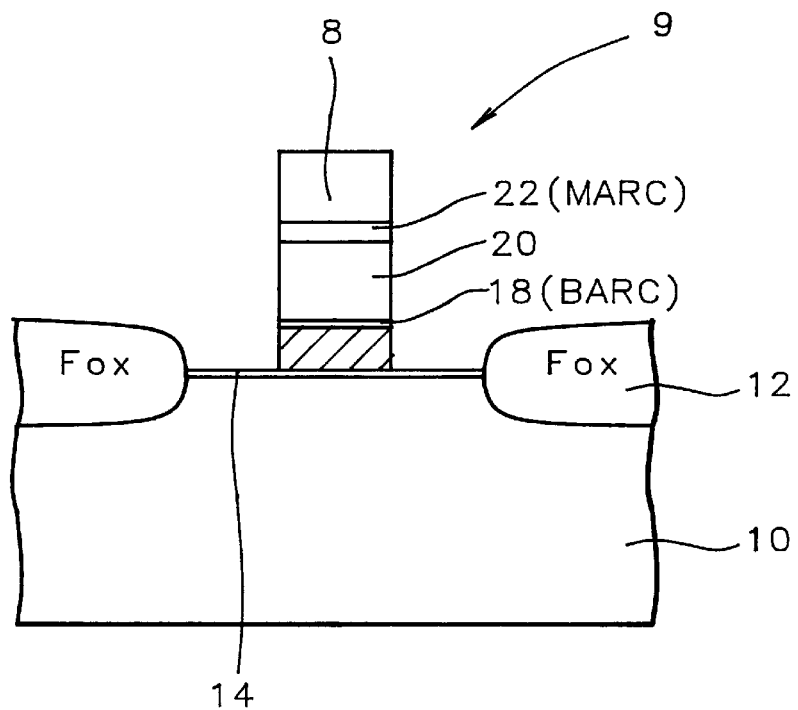

Referring to FIG. 4, the silylated pattern 8 is used as an etch mask to etch the unsilylated second photoresist layer 24, the underlying middle anti-reflective layer 22, the first photoresist layer 20, and the bottom anti-reflective layer 18 to the surface of the polysilicon layer 16. The etching is carried out using plasma-enhanced dry etching, for example, using a mixture oxygen and helium.

This completes the method for making distortion-free silylated photoresist patterns 9, comprising the layers 8, 22, 20, and 18, having essentially vertical sidewalls. For the sake of completeness, FIG. 4 also shows the patterning of the polysilicon or polycide layer 16 to form the submicrometer gate electrodes for the FETs. For example, polysilicon layer 16 can be etched using a high-density plasma etcher and an etchant gas containing a chlorine species. Typically a gas mixture such as hydrogen bromide (HBr), chlorine ($Cl_2$), oxygen ($O_2$), and helium (He) is used for this etching step.

Although the invention has been particularly shown and described with reference to the preferred embodiment thereof, it will be understood by those skilled in the art that various changes in form and details may be made without departing from the spirit and scope of the invention. For example, the invention is shown for making patterned photoresist images for etching FET gate electrodes, but the method equally applies for making distortion-free photoresist images for etching closely spaced electrically conducting lines.

What is claimed is:

1. A method for making submicrometer photoresist patterns using silylation and anti-reflective coatings comprising the steps of:

providing a semiconductor substrate having patterned non-planar structures thereon;

depositing an electrically conducting layer on said substrate;

coating a bottom anti-reflective coating (BARC) layer on said electrically conducting layer;

coating a first photoresist layer on said bottom anti-reflective coating layer and baking to achieve cross-linking and to improve adhesion to the next coating layer;

coating a middle anti-reflective coating (MARC) layer on said first photoresist layer;

coating a second photoresist layer on said middle anti-reflective layer;

forming a latent image pattern in said second photoresist layer by exposure to optical radiation through a mask where said submicrometer photoresist patterns are desired;

forming selectively a silylation layer on said latent image pattern by carrying out a silylation process;

removing by oxygen plasma etching said second photoresist layer, said anti-reflective coatings, and said first photoresist layer while using said silylation layer as an etching mask thereby completing said submicrometer photoresist patterns for masking and etching said underlying electrically conducting layer.

2. The method of claim 1, wherein said electrically conducting layer is a conductively doped polysilicon having a thickness of between about 500 and 3000 Angstroms.

3. The method of claim 1, wherein said electrically conducting layer is a polycide layer having a thickness of between about 500 and 2000 Angstroms.

4. The method of claim 1, wherein said bottom anti-reflective coating (BARC) layer and said middle anti-reflective coating (MARC) layer are polymer films having an optical thickness equal to one-quarter the wavelength of said optical radiation thereby providing destructive interference of any reflected optical radiation.

5. The method of claim 4, wherein said anti-reflective coatings are composed of amorphous silicon.

6. The method of claim 1, wherein said first photoresist is a negative type photoresist having a thickness of between about 3000 and 15000 Angstroms.

7. The method of claim 1, wherein said second photoresist is a positive type photoresist having a thickness of between about 3000 and 5000 Angstroms.

8. The method of claim 1, wherein said silylation process is carried out using hexamethyldisilazane (HMDS).

9. The method of claim 8, wherein said silylation process is performed by heating said substrate in an atmosphere of said hexamethyldisilazane (HMDS) thereby providing a silicon-containing layer that serves as a mask to plasma etching in oxygen.

10. The method of claim 1, wherein said second photoresist layer, said anti-reflective coatings, and said first photoresist layer are anisotropically etched using oxygen.

11. The method of claim 1, wherein the etch rate ratio of said second photoresist layer to said silylation layer is between about 10:1 and 50:1 in an oxygen plasma.

12. A method for making submicrometer photoresist patterns comprising the steps of:

providing a semiconductor substrate having field oxide areas surrounding and electrically isolating device areas on which gate electrodes for field effect transistors are formed;

thermally oxidizing said device areas to form a gate oxide;

depositing a polycide layer on said substrate;

coating a bottom anti-reflective coating (BARC) layer on said polycide layer;

coating a first photoresist layer on said bottom anti-reflective coating layer and baking to achieve cross-linking and to improve adhesion to the next coating layer;

coating a middle anti-reflective coating (MARC) layer on said first photoresist layer;

coating a second photoresist layer on said middle anti-reflective layer;

forming a latent image pattern in said second photoresist layer by exposure to optical radiation through a mask where said submicrometer photoresist patterns are desired;

forming selectively a silylation layer on said latent image patterns by carrying out a silylation process;

removing by plasma etching said second photoresist layer, said anti-reflective coatings, and said first photoresist layer while using said silylation layer as an etching mask thereby forming said submicrometer photoresist patterns for masking and etching said underlying polycide layer;

anisotropically etching said polycide layer thereby completing said gate electrodes for said field effect transistors.

13. The method of claim 12, wherein said polycide layer is composed of an $N^+$ doped polysilicon layer having a tungsten silicide layer on its top surface.

14. The method of claim 12, wherein said polycide layer has a thickness of between about 500 and 3000 Angstroms.

15. The method of claim 12, wherein said bottom anti-reflective coating (BARC) layer and said middle anti-reflective coating (MARC) layer are polymer films having an optical thickness equal to one-quarter the wavelength of said optical radiation thereby providing destructive interference with any reflected optical radiation.

16. The method of claim 15, wherein said anti-reflective coatings are composed of titanium nitride.

17. The method of claim 12, wherein said first photoresist is a negative type photoresist having a thickness of between about 3000 and 15000 Angstroms.

18. The method of claim 12, wherein said second photoresist is a positive type photoresist having a thickness of between about 3000 and 5000 Angstroms.

19. The method of claim 12, wherein said silylation process is carried out using hexamethyldisilazane (HMDS).

20. The method of claim 19, wherein said silylation process is performed by heating said substrate in an atmosphere of said hexamethyldisilazane (HMDS) thereby providing a silicon-containing layer that serves as a mask to plasma etching in oxygen.

21. The method of claim 12, wherein said second photoresist layer, said anti-reflective coatings, and said first photoresist layer are anisotropically etched using oxygen.

22. The method of claim 12, wherein the etch rate ratio of said second photoresist layer to said silylation layer is between about 10:1 and 50:1 in an oxygen plasma.

* * * * *